United States Patent [19]
Sakamoto

[11] Patent Number: 5,393,988
[45] Date of Patent: Feb. 28, 1995

[54] MASK AND CHARGED PARTICLE BEAM EXPOSURE METHOD USING THE MASK

[75] Inventor: Kiichi Sakamoto, Tokyo, Japan

[73] Assignee: Fujitsu Limited, Kawasaki, Japan

[21] Appl. No.: 227,696

[22] Filed: Apr. 14, 1994

Related U.S. Application Data

[63] Continuation of Ser. No. 40,380, Feb. 26, 1993, abandoned, which is a continuation of Ser. No. 883,901, May 12, 1992, abandoned, which is a continuation of Ser. No. 763,498, Sep. 23, 1991, abandoned, which is a continuation of Ser. No. 429,498, Oct. 31, 1989, abandoned.

[30] Foreign Application Priority Data

Nov. 4, 1988 [JP] Japan ................ 63-279605

[51] Int. Cl.$^6$ ............................................. H01J 37/00
[52] U.S. Cl. .............................. 250/492.22; 250/398
[58] Field of Search ......... 250/492.22, 491.1, 492.2 R, 250/398; 378/34, 35

[56] References Cited

U.S. PATENT DOCUMENTS

| | | | |
|---|---|---|---|
| 4,213,053 | 7/1980 | Pfeiffer | 250/492.23 |
| 4,334,156 | 6/1982 | Bohlen et al. | 250/491.1 |
| 4,603,473 | 8/1986 | Suemitsu et al. | 250/491.1 |
| 4,823,011 | 4/1989 | Stengel et al. | 250/491.1 |
| 4,823,012 | 4/1989 | Kosugi | 250/491.1 |
| 4,849,313 | 7/1989 | Chapman et al. | 430/5 |

FOREIGN PATENT DOCUMENTS

| | | |
|---|---|---|
| 0027497 | 4/1981 | European Pat. Off. . |
| 2231916 | 8/1987 | European Pat. Off. . |
| 0286086 | 10/1988 | European Pat. Off. . |
| 119185 | 1/1977 | Japan . |
| 260322 | 2/1987 | Japan . |
| 3130422 | 5/1982 | Netherlands . |
| 3727453 | 3/1988 | Netherlands . |

OTHER PUBLICATIONS

Randal et al., "Masked Ion Beam Resist Exposure Using Grid Support Stencil Masks", J. Vac. Sci. Technol. B3(1), Jan./Feb. 1985.
Zapka et al., "High Resolution Distortion Measurements of Electron–Beam Transmission Masks", J. Vac. Sci. Technol. B3(1), Jan./Feb. 1985.
Levi, "A Li ne Electron Lens", J. Vac. Sci. Technol. B3(1), Jan./Feb. 1985.

Primary Examiner—Paul M. Dzierzynski
Assistant Examiner—Kiet T. Nguyen
Attorney, Agent, or Firm—Staas & Halsey

[57] ABSTRACT

A mask is used for exposing a desired pattern on a substrate by a charged particle beam exposure. The mask comprises a plurality of pattern groups each including a plurality of exposure patterns within an approximately rectangular region, and a plurality of position matching patterns formed at positions different from those of the exposure pattern groups, where positional relationships of each of the exposure pattern groups and the position matching patterns are predetermined and fixed.

23 Claims, 4 Drawing Sheets

MASK AND CHARGED PARTICLE BEAM EXPOSURE METHOD USING THE MASK

This application is a continuation of application Ser. No. 08/040,380, filed Feb. 26, 1993, now abandoned, which is a continuation of application Ser. No. 07/883,901, filed May 12, 1992, now abandoned, which is a continuation of application Ser. No. 07/763,498, filed Sep. 23, 1991, now abandoned, which is a continuation of application Ser. No. 07/429,498, filed Oct. 31, 1989, now abandoned.

BACKGROUND OF THE INVENTION

The present invention generally relates to masks and exposure methods using the masks, and more particularly to a mask which is used to form a desired pattern by use of a charged particle beam such as an electron beam and an exposure method which uses the mask to efficiently and stably form the desired pattern.

Heretofore, photolithography mainly has been used for forming fine patterns. But recently, due to the further increase in the integration density of integrated circuits, new exposure techniques have been developed and reduced to practice. The new exposure techniques use an X-ray and a charged particle beam such as an electron beam.

The charged particle beam exposure forms a pattern by use of a charged particle beam such as an electron beam which can be controlled electromagnetically. One notable feature of the charged particle beam exposure is the fact that it is possible to form fine patterns in the submicron order. The charged particle beam exposure can generally be classified into a Gaussian beam exposure and a shaped beam exposure. These exposure techniques can further be divided into a system of drawing while continuously moving a substrate by continuously moving a stage and a step-and-repeat system of drawing while moving the substrate a predetermined amount for every drawing region.

The trend to further increase the integration density of integrated circuits is rapidly accelerating. Compared to the optical beam, the diameter of the minimum spot which can be formed by the electron beam is far smaller than that achievable by the optical beam. For this reason, the electron beam exposure fully satisfies the demand for increased integration density from the point of view of the resolution. However, from the practical point of view, there is a problem in that the exposure time is long. This problem of long exposure time is caused by the fact that the charged particle beam exposure method draws in one stroke.

In the semiconductor device production apparatus which employs the electron beam exposure method, various methods have been proposed to reduce the exposure (drawing) time. One proposed method exposes the pattern in parts by use of a transmission mask which has predetermined patterns so as to reduce the exposure time. Another method uses a transmission mask which has a pattern formed for the entire exposure region and exposes the pattern in one shot. Still another method uses a transmission mask which has patterns for exposing a selected pattern using a shaped electron beam with a rectangular shape, a square shape, a triangular shape or the like.

For example, a Japanese Laid-Open Patent Application No. 52-119185 proposes a method of selectively irradiating an electron beam on a transmission mask which has different patterns formed at different block positions, and one block is exposed in one shot. A method of exposing a desired pattern by use of a transmission mask which is formed with the desired pattern in its entirety is reported in J. Vac. Sci. Technol. B3(1), January/February 1985(140). A method of forming the transmission mask which may be used in these methods is reported in J. Vac. Sci. Technol. B3(1), January/February 1985(58). A method of reducing the pattern to 1/10 similarly to the step-and-repeater of an ion beam exposure is reported in J. Vac. Sci. Technol. B3(1), January/February 1985(194). Furthermore, a Japanese Laid-Open Patent Application No. 62-260322 proposes an electron beam exposure apparatus which makes an exposure using a stop plate having rectangular holes for forming a repetition pattern which is necessary for forming a memory cell or the like and a general rectangular pattern.

Out of the above proposed methods, the method proposed in the Japanese Laid-Open Patent Application No. 62-260322 was most suited for reducing the exposure time.

FIG. 1 is a perspective view of a semiconductor device production apparatus for explaining a conventional electron beam exposure method proposed in the Japanese Laid-Open Patent Application No. 62-260322. In FIG. 1, the semiconductor device production apparatus comprises an electron gun 51, a first rectangular aperture 52, a convergent lens 53, and an electrostatic deflector 54 for selecting a mask pattern and varying a transmitting beam size. The deflector 54 has a function of moving an electron beam and at least one such deflector is normally necessary when making the exposure with a variable rectangular shaped beam. In FIG. 1 there are also shown a transmission mask 55 which is also referred to as a stencil mask, a design pattern 56, and a wafer 57 which is to be subjected to the exposure.

The design pattern 56 is preformed in the transmission mask 55. This design pattern 56 may be formed by a variable shaped beam which has a rectangular shape, a square shape, a triangular shape or the like, for example. Transmission holes through which the electron beam is transmitted are formed in the transmission mask 55, and groups of design patterns 56 are formed within the same layer as these transmission holes. A convergent lens (not shown) is provided between the deflector 54 and the transmission mask 55.

A description will now be given of the operating principle of this conventional semiconductor device production apparatus. As shown in FIG. 1, the transmission mask 55 which comprises the groups of design patterns 56 within the same layer as the electron beam shaping or exposure is located at a position where the electron beam passes, so that the exposure is made by selectively irradiating the electron beam on the groups of design patterns 56. The group of design patterns 56 on the transmission mask 55 is selected by deflecting the electron beam to a focal point position by use of the deflector 54. The pattern is exposed on the wafer 57 by the appropriate projection of the electron beam which is transmitted through the transmission holes in the transmission mask 55.

The method of providing the plurality of patterns on the transmission mask and deflecting the electron beam depending on the pattern to be used for the exposure is an effective method from the point of view of realizing a high-speed exposure. But when the electron beam is deflected by a deflecting system, an image distortion is inevitably introduced at the wafer surface. In other words, even when the electron beam is deflected to irradiate the same position on the wafer through two patterns of the transmission mask located at mutually different positions, the irradiated position on the wafer becomes different for the two cases, that is, different for the two patterns used. Therefore, there is a need to correct the irradiating position of the electron beam on the wafer depending on the pattern used, that is, the position of the pattern in the transmission mask.

It is possible to detect the irradiating position of the electron beam on the wafer by use of a reflected .electron beam detector which detects the electron beam which is reflected at the wafer surface. However, because the patterns of the transmission mask are complex and mutually different, it is impossible to accurately detect whether or not the irradiating position of the electron beam through the two patterns actually coincide on the wafer. Hence, an operator monitors all image on a scanning electron microscope (SEM) to approximately determine the image distortion based on the images obtained for the two patterns of the transmission mask, but it takes time to make the required measurements and the measured results are not very accurate. Further, the irradiating position of the electron beam on the wafer through a pattern of the transmission mask inevitably changes with time even when the same pattern is used due to impurities and the like which adhere on the transmission mask. But the efficiency of the exposure apparatus becomes extremely poor if the above described measurements must be carried out frequently to correct the image distortion prior to the actual exposure.

SUMMARY OF THE INVENTION

Accordingly, it is a general object of the present invention to provide a novel and useful mask and a particle beam exposure method using the mask, in which the above described problems are overcome.

Another and more specific object of the present invention is to provide a mask for use in exposing a desired pattern on a substrate by a charged particle beam exposure and particularly a mask comprising a plurality of pattern groups each including a plurality of patterns within an approximately rectangular region, and a plurality of position matching patterns formed at positions different from those of the pattern groups, where positional relationships of each of the pattern groups and the position matching patterns are predetermined and fixed. According to the mask of the present invention, it is possible to calculate the amount of correction necessary for eliminating image distortion at the substrate surface by use of the position matching patterns in the mask, prior to the actual exposure of a desired pattern.

Still another object of the present invention is to provide a charged particle beam exposure method for exposing a desired pattern on a substrate by a charged particle beam, where the desired pattern is one of a plurality of patterns which are formed in a mask in a form of pattern groups and selected by appropriately deflecting the charged particle beam in a deflection system depending on the position of the desired pattern, which charged particle beam exposure method comprises a first step for exposing one of a plurality of position matching patterns in the mask at a predetermined position on the substrate by the charged particle beam by passing the charged particle beam through the deflection system, where each of the position matching patterns has a predetermined fixed positional relationship to at least an adjacent pattern group in the mask, a second step for detecting an irradiating position of the charged particle beam through the one position matching pattern, a third step for exposing another position matching pattern in the mask at the predetermined position on the substrate by the charged particle beam by passing the charged particle beam through the deflection system, a fourth step for detecting an irradiating position of the charged particle beam through the other position matching pattern, a fifth step for calculating an error between the irradiating positions of the charged particle beam which is irradiated on the substrate through the one and the other position matching patterns, and a sixth step for calculating a correction amount for controlling the deflection system so that the error becomes approximately zero. According to the charged particle beam exposure method of the present invention, it is possible to calculate the correction amount for eliminating an image distortion at the substrate surface by use of the position matching patterns in the mask prior to the actual exposure of the desired pattern. Therefore, the image distortion at the substrate surface is positively eliminated regardless of the position of the selected desired pattern in the mask, that is, regardless of the deflection quantity of the charged particle beam.

Other objects and further features of the present invention will be apparent from the following detailed description when read in conjunction with the accompanying drawings.

DESCRIPTION OF THE PREFERRED EMBODIMENTS

Figure 2:
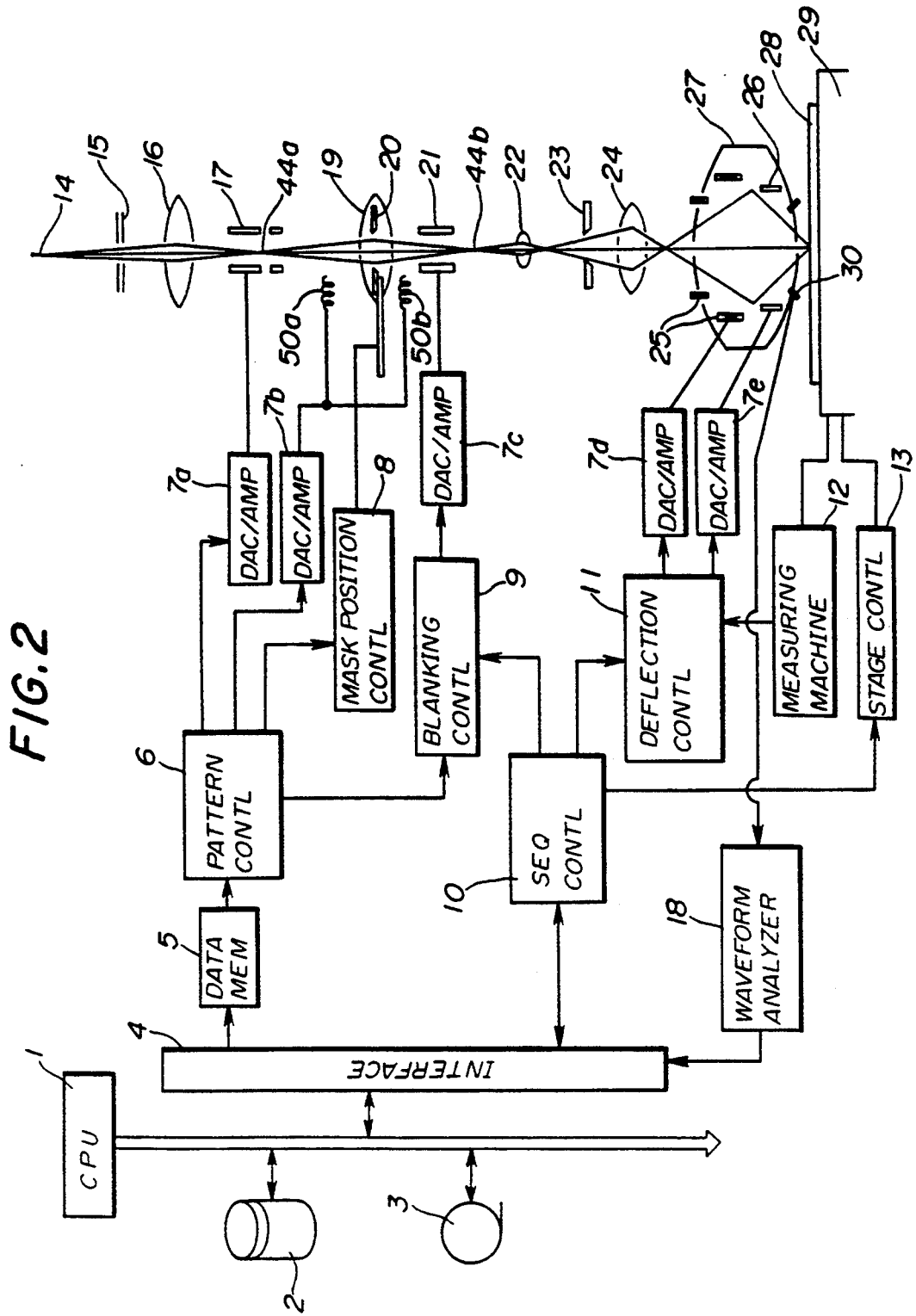
FIG. 2 is a diagram generally showing an exposure apparatus which is employed and operated in accordance with he charged particle beam exposure method according to the present invention.

FIG. 2 generally shows an exposure apparatus which is operated in accordance with an embodiment of a charged particle beam exposure method according to the present invention. The exposure apparatus comprises a central processing unit (CPU) 1, a magnetic disk-2, a magnetic tape 3, an interface 4, a data memory 5, a pattern controller 6, digital-to-analog converter and amplifiers (hereinafter simply referred to as DAC/AMPs) 7a through 7e, a mask position control circuit 8, a blanking control circuit 9, a sequence controller 10, a deflection control circuit 11, a laser interferometric measuring machine 12, a stage controller 13, and an electron gun 14 which is used as an electron beam generating means for generating an electron beam. An aperture 15 functions as an electron beam shaping means. A first lens 16, an electrostatic deflector 17, a waveform analyzer circuit 18, and a second lens 19 which functions as an electromagnetic lens are also provided in the exposure apparatus. Deflectors 50a and 50b are provided for selecting a desired pattern in a transmission mask 20. The exposure apparatus further comprises a blanking part 21, a reduction lens 22 which functions as an electromagnetic lens, an aperture 23, a reduction lens 24 which functions as an electromagnetic lens, a main deflector 25, a sub deflector 26, an objective lens 27, a stage 29 for holding a wafer 28 and having a function of appropriately moving the position of the wafer 28, and a reflected electron detector 30. In FIG. 2, 44a and 44b are crossover points.

Figure 3:
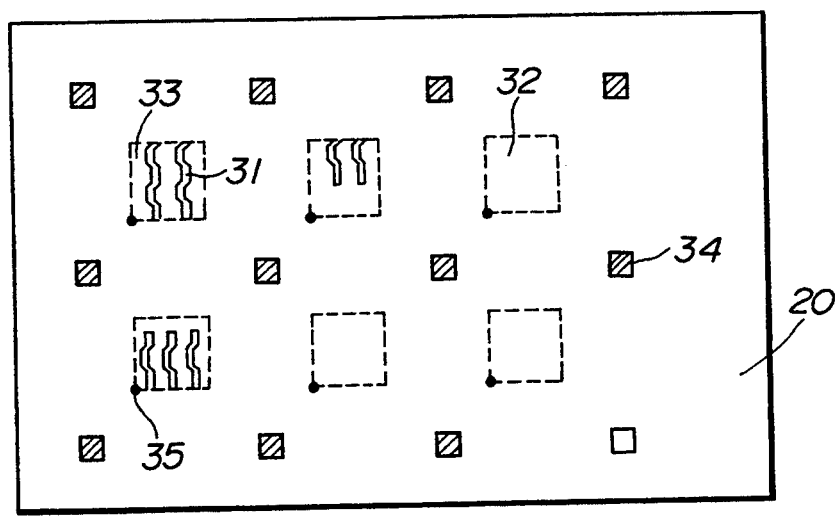
FIG. 3 is a plan view showing a first embodiment of a mask according to the present invention.

FIG. 3 shows a first embodiment of the transmission mask 20. In FIG. 3, the transmission mask 20 comprises transmission holes 31, rectangular holes 32 for forming variable rectangular shapes, pattern groups 33 respectively made up of the transmission holes 31, position matching patterns 34, and reference points 35 provided within the respective pattern groups 33.

Figure 4A:
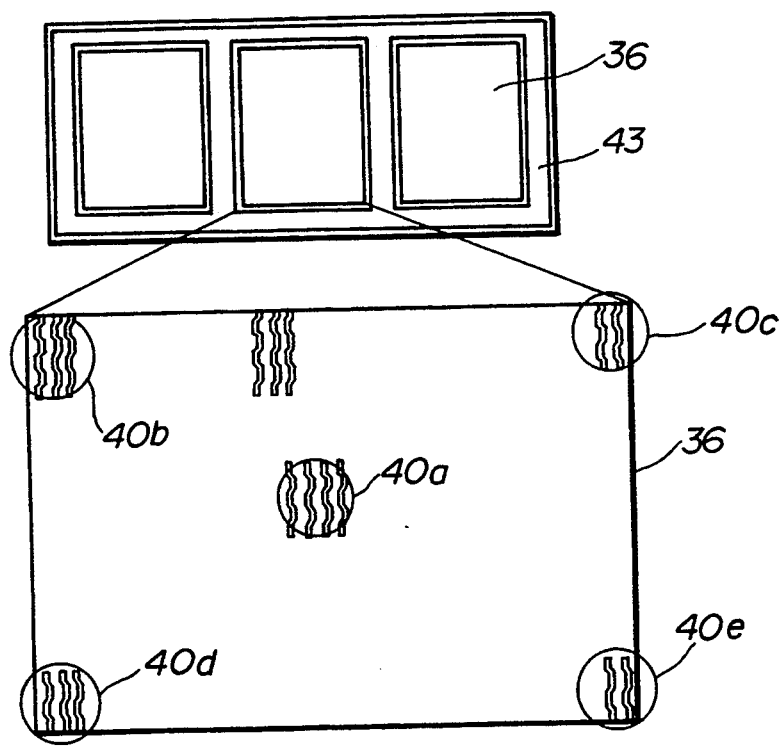
FIGS. 4A, 4B and 4C respectively are diagrams for explaining a pattern which is exposed by the charged particle beam exposure method according to the present invention.
Figure 4B:
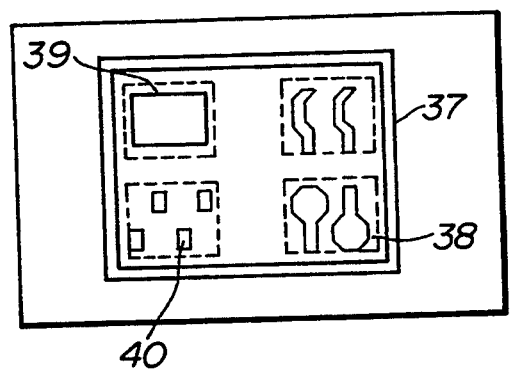
Figure 4C:
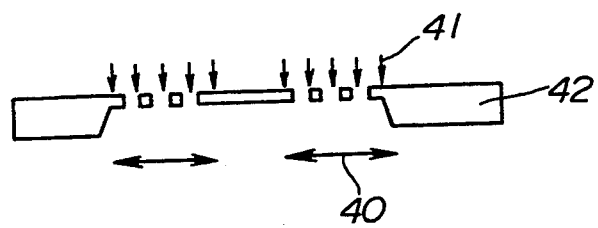

FIGS. 4A, 4B and 4C respectively are diagrams for explaining a pattern which is exposed in the embodiment of the charged particle beam exposure method according to the present invention. FIG. 4A shows a cell pattern part and a peripheral pattern part of an IC chip which is exposed, FIG. 4B shows a mask pattern for the exposed IC pattern by extracting those patterns (such as 40a through 40e) shown in FIG. 4A which are used frequently, and FIG. 4C shows a cross section of the IC chip (substrate 42). In FIGS. 4A to 4C there are shown a cell pattern part 36, an electron beam deflectable region 37, a pattern formable region 38, an hole 39 for a non-repetitive pattern, a pattern 40, an electron beam 41, a substrate 42 which is made of silicon (Si), for example, a peripheral pattern part 43.

The reduction lenses 22 and 24 respectively function as a means for reducing the electron beam which is transmitted therethrough. The main and sub deflectors 25 and 26 function as a means for deflecting the electron beam on the wafer 28.

Next, a description will be given of the operating principle of the exposure apparatus shown in FIG. 2. Data related to the variable rectangular shape or the like are input to the CPU I from the magnetic disk 2 or the magnetic tape 3. Each pattern data is supplied to the pattern controller 6 via the interface 4 and the data memory 5. The electrostatic deflector 17 is controlled by the pattern controller 6 via the DAC/AMP 7a and the size of the electron beam and the like are controlled for the variable rectangular shape. The position of the pattern to be selected in the transmission mask 20 is also controlled by the pattern controller 6 which controls the deflectors 50a and 50b via the DAC/AMP 7b. The mask position control circuit 8 controls the position of the transmission mask 20 in response to an output of the pattern controller 6. The blanking control circuit 9 determines whether or not to project the pattern based on outputs of the pattern controller 6 and the sequence controller 10 which are obtained via the DAC/AMP 7c. The main deflector 25 determines a large range to be exposed in response to an output of the deflection control circuit 11 which is obtained via the DAC/AMP 7d, and the sub deflector 26 determines the position of the electron bean spot in response to an output of the deflection control circuit 11 which is obtained via the DAC/AMP 7e. The spot position is measured by the laser interferometric measuring machine 12 which measures the position of the stage 29, and the measured data is supplied to the deflection control circuit 11. The main and sub deflectors 25 and 26 are readjusted based on the control of the deflection control circuit 11.

When the electron beam is rotated and irradiated on the wafer 28, the spot position is measured by the reflected electron detector 30 which detects the reflected electrons from the wafer 28. The measured data from the reflected electron detector 30 is supplied to the waveform analyzer circuit 18. Necessary calculations on the measured data are made in the CPU 1 which receives the measured data via the interface 4. The second lens 19 and the reduction lenses 22 and 24 are readjusted based on control outputs of the waveform analyzer circuit 18.

For the sake of convenience, it is assumed that FIGS. 4A through 4C show the pattern of the semiconductor device to be exposed by the exposure apparatus. FIGS. 4A through 4C show the case where the semiconductor device is a dynamic random access memory (DRAM). The semiconductor device in this case is generally formed from the cell pattern part 36 which actually stores the information and the peripheral pattern part 43 which supervises the cell pattern part 36 or supervises the signal communication between the semiconductor device and an external device. In order to improve the integration density, the cell pattern part 36 is formed with fine pattern rulings as shown in FIG. 4A, and the cell pattern part 36 comprises a repetition of a minimum number of basic patterns each including several cells. The pattern groups 33 of the transmission mask 20 respectively have a pattern 40a which includes a repetitive pattern, and patterns 40b, 40c and 40d which include no repetitive patterns but are fine patterns.

Figure 1:
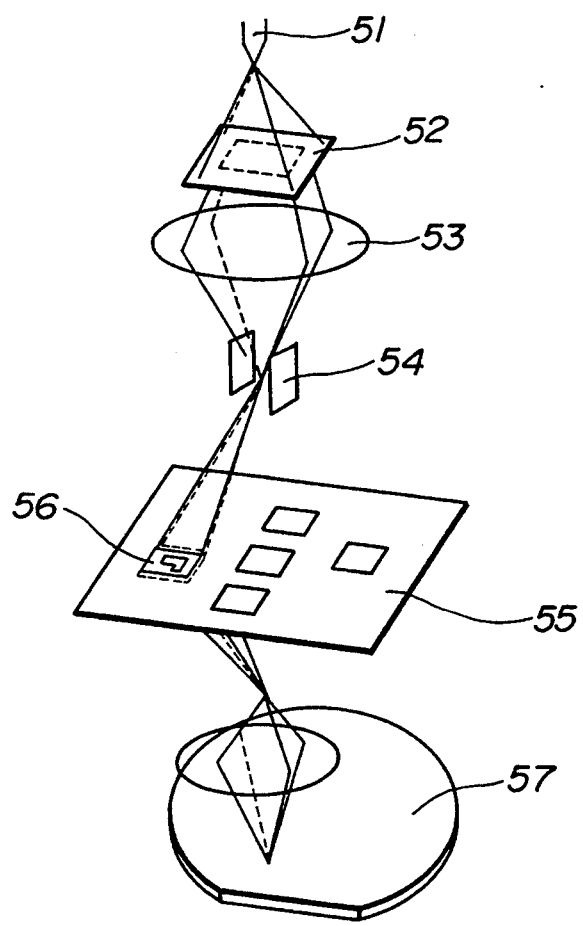
FIG. 1 is a perspective view showing a semiconductor device production apparatus for explaining a conventional electron beam exposure method.

In order to efficiently expose such patterns, 1 the transmission mask 20must have a plurality of pattern groups 33, and the efficiency of the exposure is better if the number of the pattern groups 33 is large. The principle of the exposure is basically the same as that described before in conjunction with FIG. 1. In other words, the transmission mask 20 which comprises the pattern groups 33 is arranged at a position where the electron beam passes, within a layer in which the electron beam is shaped or exposed, so as to irradiate a selected pattern group 33 by the electron beam to make the exposure. The desired pattern group 33 is selected by deflecting the electron beam to the focal point by use of the electrostatic deflector 17. The pattern is exposed on the wafer 28 by the appropriate projection of the electron beam which passes the transmission holes 31 onto the wafer 28.

In this embodiment, the transmission mask 20 which is used has in addition to the pattern groups 33 the plurality of position matching patterns 34. The positional relationship between the pattern groups 33 and the position matching patterns 34 is predetermined. When exposing the pattern group 33, the exposure is made by determining the irradiating position of the electron beam on the transmission mask 20 with reference to the position matching patterns 34. Accordingly, it is possible to provide in the transmission mask 20 a plurality of pattern groups 33 for the exposure and to accurately expose the patterns on the wafer 28 regardless of the position of each pattern in the transmission mask 20. The exposure of the patterns on the wafer 28 can be made efficiently within a short time.

It is possible to stably make the exposure when the positional relationship is known between the position on the transmission mask 20 where the electron beam is irradiated and the irradiating position on the wafer 28.

In order to know this positional relationship, the irradiating position on the wafer 28 is monitored by use of the position matching pattern 34, and when exposing the pattern group 33 the irradiating position of the electron beam on the transmission mask 20 is determined with reference to the position matching pattern 34.

The region in which the pattern groups 33 are formed in the transmission mask 20 is determined but the patterns of the transmission holes 31 are actually formed in a portion of the region and only the patterns of the transmission holes 31 can be discriminated on the wafer 28. Accordingly, in order to satisfactorily and stably make the exposure, it is desirable to form the reference point 35 within the pattern group 33 in the transmission mask 20 as shown in FIG. 3, form the position matching patterns 34 in the matrix arrangement, and form the pattern groups 33 so that the positional relationship between the reference point 35 within the pattern group 33 and one or plurality of position matching patterns 34 is predetermined and fixed. The exposure data includes the position of the reference point 35 and the mask pattern in the coded form.

When many patterns are arranged in the transmission mask 20 and one pattern is selected by deflecting the electron beam, the patterned electron beam is easily distorted. Hence, it is desirable to detect whether or not the electron beam is distorted and to correct the electron beam when the distortion exists.

In this embodiment, the following steps are carried out prior to the actual exposure of a desired pattern.

First, a first arbitrary position matching pattern 34 in the transmission mask 20 is selected by the pattern controller 6 and exposed at a predetermined position on the wafer 28. For example, a minute projection is provided at the predetermined position on the wafer 28. The irradiating position of the electron beam on the wafer 28 is detected by the reflected electron detector 30 and the waveform analyzer circuit 18. The data from the waveform analyzer circuit 18 is temporarily stored in the data memory 5 via the interface 4.

.Second, a second arbitrary position matching pattern 34 in the transmission mask 20 is selected by the pattern controller 6 and exposed at the predetermined position on the wafer 28. This second arbitrary position matching pattern 34 is located at a position in the transmission mask 20 different from that of the first arbitrary position matching pattern 34. The data on the irradiating position of the electron beam on the wafer 28 is detected similarly as described above and temporarily stored in the data memory 5.

Third, the CPU 1 calculates the error in the irradiating positions of the electron beam between the two cases using the first and second arbitrary position matching patterns 34. In this embodiment, the error can be calculated with ease and with a high accuracy because the shape of the position matching patterns 34 are rectangular which makes it easy to detect the irradiating position of the electron beam. The calculated error is stored in the data memory 5.

Fourth, the first through third steps are repeated for the remaining position matching patterns 34 in the transmission mask 20.

Therefore, when an arbitrary pattern group 33 in the transmission mask 20 is selected to actually expose the desired pattern on the wafer 28, it is possible to correct the image distortion which is generated depending on the position of the selected pattern group 33 in the transmission mask 20. Because the positional relationship between each pattern group 33 or at least the reference point 35 of each pattern group 33 and at least the adjacent position matching patterns 34 are predetermined (fixed) and known, it is possible to calculate the correction amount for the selected pattern group 33 based on the calculated errors which are stored in the data memory 5. The pattern controller 6 controls the deflectors 50a and 50b via the DAC/AMP 7b based on the correction amount which is calculated in the CPU 1 so that the image distortion becomes a minimum. As a result, the electron beam is accurately irradiated at the intended position on the wafer 28 regardless of the position of the selected pattern group 33 in the transmission mask 20, that is, the image distortion is effectively eliminated so that the error becomes approximately zero.

The above described calculation of the errors prior to the actual exposure of the desired pattern may be carried out at an arbitrary frequency. In addition, the number and position of the position matching patterns 34 are not limited to those of FIG. 3. Further, the position matching pattern 34 may have an arbitrary shape as long as the positional errors between two exposures at the predetermined position on the wafer 28 is easily detectable by the reflected electron detector 30 and the waveform analyzer circuit 18.

The method of calculating the correction amount basically depends on the number of the position matching patterns 34 formed in the transmission mask 20. When a relatively large number of position matching patterns 34 are provided in the transmission mask 20, it is for example possible to consider the error of the selected pattern group 33 to be approximately the same as the error of the closest position matching pattern 34 and calculate the correction amount based on the error of the closest position matching pattern 34. As an alternative, it is possible to calculate the error of the selected pattern group 33 from an interior division of the errors of the closest position matching patterns 34 which surround the selected pattern group 33 by the distances between the selected pattern group 33 and the closest surrounding position matching patterns 34. This latter method is especially suitable when the number of position matching patterns 34 is relatively small. Furthermore, although the deflection of the electron beam to selectively irradiate the selected pattern group 33 in the transmission mask 20 causes changes in rotation, reduction and horizontal position of the desired pattern which is exposed on the wafer 28, these changes can effectively be eliminated by the latter method.

The first embodiment of the transmission mask 20 has the position matching patterns 34 located at various positions in the transmission mask 20. For this reason, the number of pattern groups 33 which may be formed in the transmission mask 20 becomes limited by the existence of the position matching patterns 34.

Figure 5:
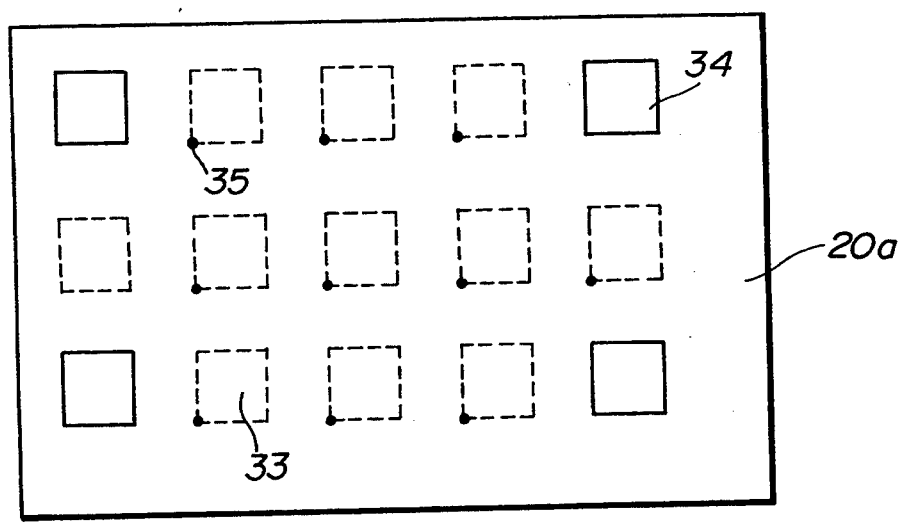
FIG. 5 is a plan view showing a second embodiment of the mask according to the present invention.

Next, a description will be given of a second embodiment of the mask according to the present invention, by referring to FIG. 5. According to a transmission mask 20a shown in FIG. 5, the position matching patterns 34 are only provided at four corner portions of the transmission mask 20a. This embodiment is a more desirable than the first embodiment in that the position matching patterns 34 are provided at the outermost peripheral portion of the transmission mask 20a and the total number of the position matching patterns 34 is four, thereby leaving a large area for forming the pattern groups 33.

A description of the method of correcting the image distortion when using the transmission mask 20a will be omitted because the method is basically the same as that for the case described above where the transmission mask 20 is used. Of course, the latter method of calculating the correction amount is preferable when using the transmission mask 20a.

In the embodiments described heretofore, the mask and the method according to the present invention are applied to the production of semiconductor devices. However, it is of course possible to apply the present invention to the production of reticles and masks.

Further, the present invention is not limited to these embodiments, but various variations and modifications may be made without departing from the scope of the present invention.

What is claimed is:

1. A charged particle beam exposure method for exposing a desired exposure pattern on a substrate by a charged particle beam of a beam source and deflection system, said charged particle beam exposure method comprising:
   providing a mask having formed therein a plurality of exposure patterns, defining desired patterns to be selectively exposed on the substrate and arranged in pattern groups, and a plurality of position matching patterns, each of said position matching patterns having a predetermined, fixed positional relationship to at least an adjacent pattern group in the mask;
   in a first step, exposing a first one of the plurality of position matching patterns in the mask at a predetermined position on the substrate by directing the charged particle beam through the selected position matching pattern in the mask and onto the predetermined position on the substrate;
   in a second step, detecting the irradiating position of the charged particle beam on the substrate, as directed through said first position matching pattern;
   in a third step, exposing a second one of the position matching patterns in the mask at the predetermined position on the substrate by directing the charged particle beam through the second position matching pattern in the mask and onto the predetermined position on the substrate;
   in a fourth step, detecting the irradiating position of the charged particle beam on the substrate, as directed through said second position matching pattern;
   in a fifth step, calculating an error between the irradiating positions of the charged particle beam which is irradiated on the substrate through said first and second position matching patterns;
   in a sixth step, calculating a correction amount for controlling the deflection system thereby to reduce said calculated error to approximately zero; and
   in a seventh step, determining a correction amount for the desired exposure pattern in the mask, based on the correction amount calculated for the first and second position matching patterns.

2. The charged particle beam exposure method as claimed in claim 1 which further comprises:
   in all eighth step, controlling the deflection system based on the correction amount determined for the desired exposure pattern so that the error in the exposure of the desired exposure pattern on the substrate is reduced to approximately zero.

3. The charged particle beam exposure method as claimed in claim 2 wherein, in the seventh step, the correction quantity for the desired pattern is determined to be the same as the correction amount calculated for the first and second position matching patterns.

4. The charged particle beam exposure method as claimed in claim 1 wherein said first through sixth steps are repeated for all the position matching patterns in the mask.

5. The charged particle beam exposure method as claimed in claim 4 which further comprises:
   in an eighth step, controlling the deflection system based on the correction amount determined for the desired exposure pattern so that the error in the exposure of the desired exposure pattern on the substrate is reduced to approximately zero.

6. The charged particle beam exposure method as claimed in claim 5 wherein, in the seventh step, the correction quantity for the desired pattern is determined to be the same as the correction amount calculated for the position matching pattern which is closest to the desired exposure pattern.

7. The charged particle beam exposure method as claimed in claim 5 wherein the correction quantity for the desired pattern is determined by an interior division of the correction amounts, as calculated for the position matching patterns which are closest to and surround the desired exposure pattern, by the distances between the desired exposure pattern and the closest surrounding position matching patterns.

8. The charged particle beam exposure method as claimed in claim 1 wherein the pattern groups and the position matching patterns are respectively arranged in corresponding matrix arrangements in the mask.

9. The charged particle beam exposure method as claimed in claim 8 wherein each of said position matching patterns has a rectangular shape.

10. The charged particle beam exposure method as claimed in claim 1 wherein the position matching patterns are arranged in a peripheral portion of the mask, the peripheral portion surrounding and defining a region in which the pattern groups are formed.

11. The charged particle beam exposure method as claimed in claim 10 wherein the mask is of rectangular shape, having four corner portions, and the position matching patterns are arranged at four corner portions of the mask.

12. The charged particle beam exposure method as claimed in claim 11 wherein each of the position matching patterns has a rectangular shape.

13. The charged particle mean exposure method as claimed in claim 1 wherein each of the exposure patterns of the pattern groups and of the position matching patterns is formed as holes in the mask.

14. The charged particle beam exposure method as claimed in claim 1 wherein there is provided a reference point in each of the pattern groups having a predetermined, fixed relationship to at least one of the position matching patterns adjacent to the corresponding pattern group.

15. A particle beam exposure method for exposing a desired exposure pattern on a substrate by a charged particle beam of a beam source and deflection system, said charged particle beam exposure method comprising:
   providing a mask having formed therein a plurality of exposure patterns defining desired patterns to be selectively exposed on the substrate and arranged in pattern groups and a plurality of position matching patterns, each of said position matching patterns having a predetermined, fixed positional relationship with respect to at least an adjacent pattern group in the mask;

exposing, in succession, a desired number of the plural position matching patterns in the mask at a predetermined position on the substrate by directing the charged particle beam, in succession, through each of said desired number of position matching patterns in the mask and onto the predetermined position on the substrate;

for each said exposure of the substrate at said predetermined position for the corresponding, desired number of position matching patterns, detecting the irradiating position of the charged particle beam on the substrate;

based on the detected, irradiated positions for said desired number of position matching patterns, calculating an error value and, from the error value, calculating a correction amount for controlling the deflection system thereby to reduce the error to approximately zero; and determining a correction amount for the desired exposure pattern in the mask, based on the correction amount calculated for said desired number of position matching patterns.

16. The charged particle beam exposure apparatus as claimed in claim 15, wherein said position matching patterns of said mask are arranged in a peripheral portion of said mask, the peripheral portion surrounding and defining a region in which said pattern groups are formed.

17. The charged particle beam exposure apparatus as claimed in claim 16, wherein the mask is of rectangular shape, having four corner portions, and said position matching patterns of said mask are arranged at four corner portions of said mask.

18. The charged particle beam exposure apparatus as claimed in claim 17, wherein each of said position matching patterns of said mask has a rectangular shape.

19. A charged particle beam exposure apparatus comprising:

emitting means for emitting a charged particle beam;

a mask for use in exposure and comprising a plurality of pattern groups respectively including a plurality of patterns within an approximately rectangular region and a plurality of position matching patterns formed at positions different from those of said pattern groups, positional relationships of each of said pattern groups and said position matching patterns being predetermined and fixed;

a substrate on which an image of said pattern groups and said position matching patterns is exposed;

first deflection means for selectively deflecting the charged particle beam from said emitting means and thereby directing the beam onto a selected one of said exposure pattern groups and said position matching patterns of said mask;

second deflection means for deflecting the charged particle beam, as transmitted through the selected one of said exposure pattern groups and said position matching patterns and thus imaged thereby, and thereby directing the imaged beam onto a predetermined position on said substrate;

detection means for detecting a position on said substrate irradiated by the imaged charged particle beam, as directed by said second deflection means, and for outputting position data indicative of the detected position;

first error obtaining means for obtaining a first error for an irradiated position on said substrate produced by transmission of the charged particle beam through a first one of said position matching patterns, based on the position data output from said detection means, and for outputting first error data indicative of the first error; and second error obtaining means for obtaining a second error for an irradiated position on said substrate produced by transmission of the charged particle beam through a second one of said position matching patterns, based on the position data output from said detection means, and for outputting second error data indicative of the second error; and determining means for determining a correction amount for an irradiated position on said substrate produced by transmission of the charged particle beam through one of said pattern groups, based on said first error data output from said first error obtaining means and said second error data output from said second error data obtaining means.

20. The charged particle beam exposure apparatus as claimed in claim 19, wherein said pattern groups and said position matching patterns of said mask are respectively arranged in corresponding matrix arrangements.

21. The charged particle beam exposure apparatus as claimed in claim 19, wherein each of said position matching patterns of said mask has a rectangular shape.

22. The charged particle beam exposure apparatus as claimed in claim 19, wherein each of said exposure patterns of said pattern groups and of said position matching patterns is formed as holes in the mask.

23. The charged particle beam exposure apparatus as claimed in claim 19, wherein there is provided a reference point in each of said pattern groups having a predetermined, fixed relationship to at least one of said position matching patterns adjacent to the corresponding pattern group.

* * * * *

UNITED STATES PATENT AND TRADEMARK OFFICE
CERTIFICATE OF CORRECTION

PATENT NO. : 5,393,988
DATED : Feb. 28, 1995
INVENTOR(S) : SAKAMOTO

It is certified that error appears in the above-indentified patent and that said Letters Patent is hereby corrected as shown below:

TITLE PAGE: [56] References Cited, under "OTHER PUBLICATIONS", in the "Levi" reference, line 1, change "Li ne" to --Line--.

Col. 4, line 39, change "he" to --the--.

Col. 5, line 31, change "an hole" to --a hole--;
line 43, change "CPU I" to --CPU 1--;
line 63, change "bean" to --beam--.

Col. 6, line 33, after "patterns" delete "1";
line 34, change "20must" to --20 must--.

Col. 8, line 61, change "is a" to --is--.

Col. 10, line 49 (claim 13, line 1), change "mean" to --beam--.

Signed and Sealed this

Twelfth Day of September, 1995

Attest:

BRUCE LEHMAN

*Attesting Officer*    *Commissioner of Patents and Trademarks*